(12) United States Patent
Sumita et al.

(10) Patent No.: US 6,780,674 B2
(45) Date of Patent: Aug. 24, 2004

(54) LIQUID EPOXY RESIN COMPOSITION AND SEMICONDUCTOR DEVICE

(75) Inventors: Kazuaki Sumita, Gunma-ken (JP); Haruyoshi Kuwabara, Gunma-ken (JP); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 45 days.

(21) Appl. No.: 10/327,145

(22) Filed: Dec. 24, 2002

(65) Prior Publication Data

US 2003/0155664 A1 Aug. 21, 2003

(30) Foreign Application Priority Data

Dec. 25, 2001 (JP) ........................................ 2001-391194

(51) Int. Cl.$^7$ .......................... H01L 21/58; B32B 27/38; C08L 63/00
(52) U.S. Cl. ..................... 438/108; 428/413; 428/414; 525/524; 523/400; 156/330
(58) Field of Search ................................ 156/325, 326, 156/327, 330; 523/400; 525/523, 524; 428/413, 414; 438/108, 127

(56) References Cited

U.S. PATENT DOCUMENTS

| | | | |
|---|---|---|---|
| 6,429,238 B1 | 8/2002 | Sumita et al. | |
| 6,534,193 B2 * | 3/2003 | Sumita et al. | 428/620 |
| 6,558,812 B2 * | 5/2003 | Sumita et al. | 428/620 |
| 2001/0034382 A1 * | 10/2001 | Sumita et al. | 523/466 |
| 2002/0043728 A1 * | 4/2002 | Harada | 257/787 |
| 2003/0087101 A1 * | 5/2003 | Sato et al. | 428/418 |

FOREIGN PATENT DOCUMENTS

| JP | 2001-55486 A | 2/2001 |
|---|---|---|
| JP | 2001-55487 A | 2/2001 |
| JP | 2001-55488 A | 2/2001 |

* cited by examiner

*Primary Examiner*—Philip Tucker
*Assistant Examiner*—Michael J Feely
(74) *Attorney, Agent, or Firm*—Birch, Stewart, Kolasch & Birch, LLP.

(57) ABSTRACT

In a liquid epoxy resin composition comprising a liquid epoxy resin, a curing agent, a curing accelerator, and an inorganic filler, the liquid epoxy resin is a mixture of (a) a liquid epoxy resin containing two or less epoxy functional groups and (b) a solid epoxy resin containing two or more epoxy functional groups in a weight ratio (a)/(b) of from 9/1 to 1/4, having a viscosity of up to 10,000 poises at 25° C. as measured by an E type viscometer. The composition is adherent to silicon chips, the cured product is highly resistant to humidity and thermal shocks, and the composition is useful as sealant for semiconductor devices.

9 Claims, 1 Drawing Sheet

LIQUID EPOXY RESIN COMPOSITION AND SEMICONDUCTOR DEVICE

This nonprovisional application claims priority under 35 U.S.C. § 119(a) on Patent Application No. 2001-391194 filed in JAPAN on Dec. 25, 2001, which is herein incorporated by reference.

This invention relates to a liquid epoxy resin composition which has improved adhesion to the surface of silicon chips and especially photosensitive polyimide resins, nitride films and oxide films, and cures into a product having improved resistance to humidity and to thermal shocks at high temperatures above the reflow temperature of 260° C., and is thus suitable as a sealant for semiconductor encapsulation. It also relates to a semiconductor device which is sealed with the liquid epoxy resin composition.

BACKGROUND OF THE INVENTION

The trend toward smaller sizes, lighter weights and increased capabilities in electrical equipment has led to a shift in the dominant semiconductor mounting process from pin insertion to surface mounting. Progress of semiconductor devices toward a higher degree of integration entails the enlargement of dies having a size as large as 10 mm or more per side. For semiconductor devices using such large size dies, greater stresses are applied to the die and the sealant during solder reflow. Such stresses are problematic because separation occurs at the interface between the sealant and the die or substrate, and the package cracks upon substrate mounting.

From the expectation that the use of leaded solders will be banned in the near future, a number of lead-substituted solders have been developed. Since most substitute solders have a higher melting temperature than the leaded solders, it has been considered to carry out reflow at temperatures of 260 to 270° C. At such reflow temperatures, more failures are expected with sealants of prior art liquid epoxy resin compositions. Even with flip chip type packages which have raised no substantial problems in the prior art, the reflow at such high temperatures brings about serious problems that cracks can occur during the reflow and the sealant can peel at interfaces with chips or substrates.

SUMMARY OF THE INVENTION

An object of the invention is to provide a liquid epoxy resin composition which cures into a cured product that has improved adhesion to the surface of silicon chips and especially photosensitive polyimide resins and nitride films, does not suffer a failure even when the temperature of reflow after moisture absorption elevates from the conventional temperature of nearly 240° C. to 260–270° C., does not deteriorate under hot humid conditions as encountered in PCT (120° C./2.1 atm), and does not peel or crack over several hundred cycles of thermal cycling between −65° C. and 150° C. Another object of the invention is to provide a semiconductor device which is sealed with the cured product of the liquid epoxy resin composition.

The invention pertains to a liquid epoxy resin composition comprising a liquid epoxy resin, a curing agent, a curing accelerator, and an inorganic filler. It has been found that by using as the liquid epoxy resin a mixture of (a) an epoxy resin containing two or less epoxy functional groups in a molecule and being liquid at normal temperature and (b) an epoxy resin containing two or more epoxy functional groups in a molecule and being solid at normal temperature in a weight ratio of epoxy resin (a)/epoxy resin (b) of from 9/1 to 1/4, having a viscosity of up to 10,000 poises at 25° C. as measured by an E type viscometer, while selecting the solid epoxy resin (b) from epoxy resins of the general formulae (1) to (4) shown below and combinations thereof, and compounding the components so that the composition has a toughness $K_{1c}$ of at least 3.0, there is obtained a liquid epoxy resin composition that is effectively adherent to the surface of silicon chips and especially photosensitive polyimide resins and nitride films, does not deteriorate under hot humid conditions as encountered in PCT (120° C./2.1 atm), and is fully resistant to thermal shocks. The composition is thus suited as a sealant for large die size semiconductor devices. The epoxy resins (a) and (b) are sometimes referred to as "liquid epoxy resin (a)" and "solid epoxy resin (b)," respectively.

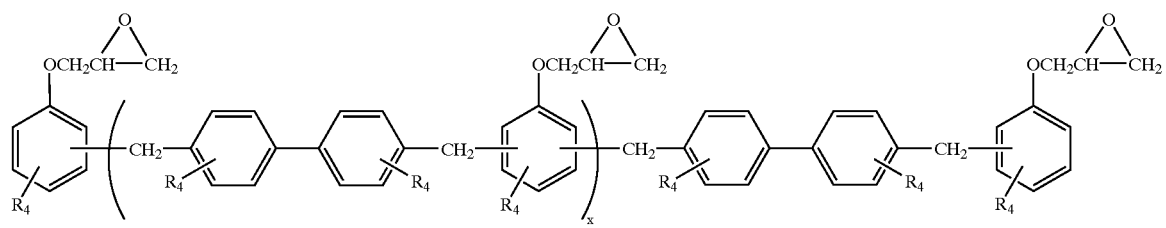

(1)

Herein R is independently hydrogen, $C_1$–$C_4$ alkyl or phenyl, and x is 0 to 10.

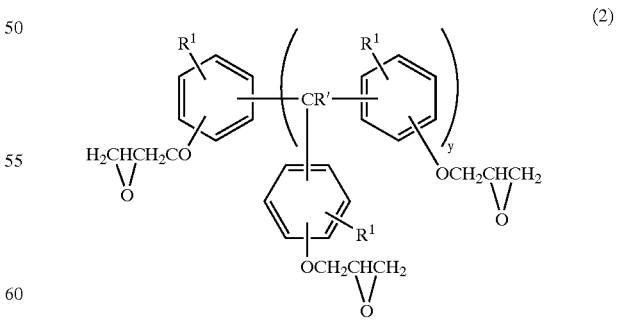

(2)

Herein $R^1$ is hydrogen or a monovalent hydrocarbon group of 1 to 6 carbon atoms, R' is hydrogen, methyl or ethyl, and y is an integer of 0 to 6.

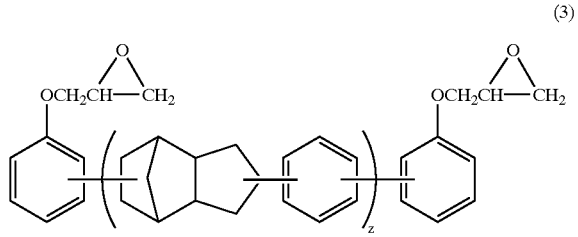
(3)

Herein z is an integer of at least 1.

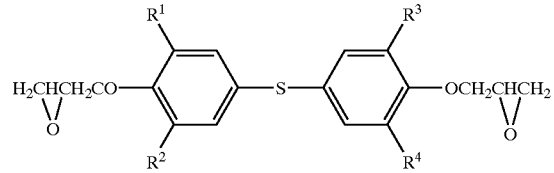
(4)

Herein $R^1$ to $R^4$ are each independently hydrogen or a monovalent hydrocarbon group of 1 to 6 carbon atoms.

Specifically, the epoxy resin (b) containing two or more epoxy functional groups in a molecule and being solid at normal temperature, that is, solid epoxy resin is well known as semiconductor sealant. However, it is not liquid and even when it is mixed with a liquid epoxy resin, the resulting mixture (or liquid epoxy resin composition) has a high viscosity and cures into a brittle product and finds few use as the sealant. Quite unexpectedly, by combining the solid epoxy resin (b) with the liquid epoxy resin (a) in a specific mixing ratio, and preferably by including a specific acid anhydride curing agent so that the cured product may become tough, there is obtained a liquid epoxy resin composition which is more adherent and more resistant to thermal shocks, and maintains excellent properties under hot humid conditions. The composition is thus suited as a sealant for large die size semiconductor devices.

Therefore, the present invention provides a liquid epoxy resin composition comprising a liquid epoxy resin, a curing agent, a curing accelerator, and an inorganic filler as essential components, wherein the liquid epoxy resin comprises a mixture of (a) an epoxy resin containing two or less epoxy functional groups in a molecule and being liquid at normal temperature and (b) an epoxy resin containing two or more epoxy functional groups in a molecule, being solid at normal temperature and selected from epoxy resins of the general formulae (1) to (4) and combinations thereof, in a weight ratio of epoxy resin (a)/epoxy resin (b) of from 9/1 to 1/4; the epoxy resin mixture has a viscosity of up to 10,000 poises at 25° C. as measured by an E type viscometer; and the composition has a toughness $K_{1c}$ of at least 3.0.

BRIEF DESCRIPTION OF THE DRAWING

The only FIGURE.

DESCRIPTION OF THE PREFERRED EMBODIMENTS

Epoxy Resin

Figure 1:
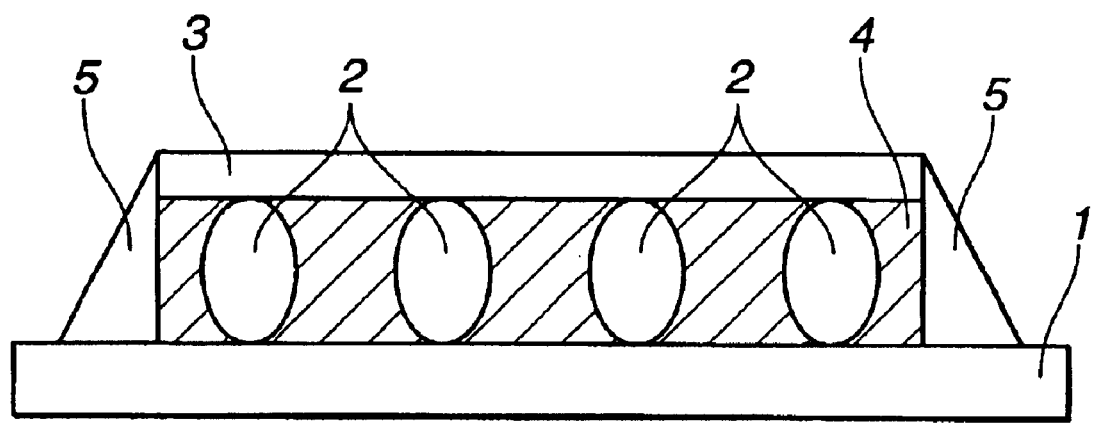
FIG. 1 is a schematic view of a flip chip-type semiconductor device according to one embodiment of the invention.

In the liquid epoxy resin composition of the invention serving as a semiconductor sealant, the liquid epoxy resin component is a mixture of liquid epoxy resin (a) and solid epoxy resin (b). Any epoxy resin may be used as the liquid epoxy resin (a) as long as it contains two or less epoxy functional groups in a molecule and is liquid at normal temperature. Preferably the liquid epoxy resin (a) has a viscosity at 25° C. of up to 2,000 poises, especially up to 500 poises. Useful liquid epoxy resins include bisphenol type epoxy resins such as bisphenol A epoxy resins and bisphenol F epoxy resins, naphthalene type epoxy resins and phenyl glycidyl ether. Of these, epoxy resins which are liquid at room temperature are desirable. It is acceptable to add another epoxy resin of the structure shown below to these liquid epoxy resins insofar as infiltration ability is not compromised.

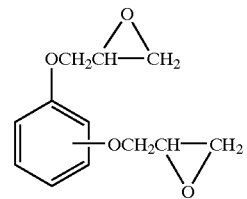

In admixture with the liquid epoxy resin (a), the epoxy resin (b) containing two or more epoxy functional groups in a molecule and being solid at normal temperature is used. The solid epoxy resin (b) is one or more of epoxy resins of the following general formulae (1) to (4).

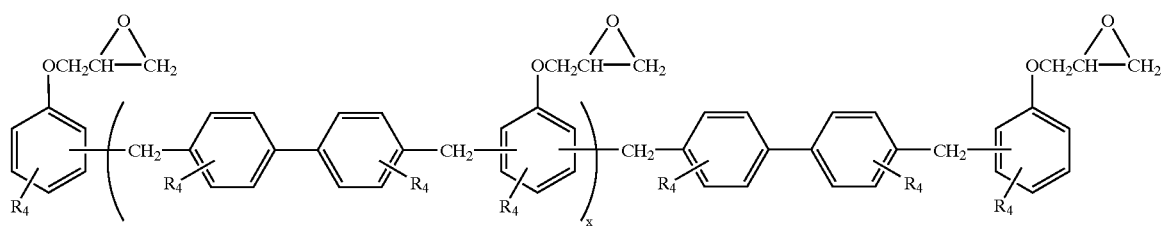
(1)

Herein R is independently hydrogen, an alkyl group of 1 to 4 carbon atoms or a phenyl group, and x is 0 to 10.

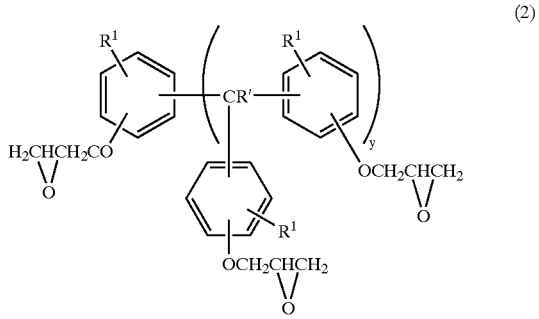
(2)

Herein $R^1$ is hydrogen or a monovalent hydrocarbon group of 1 to 6 carbon atoms, typically an alkyl group such as methyl, ethyl, propyl, isopropyl, n-butyl, isobutyl, tert-butyl, pentyl or hexyl. R' is hydrogen, methyl or ethyl, and preferably hydrogen, and y is an integer of 0 to 6.

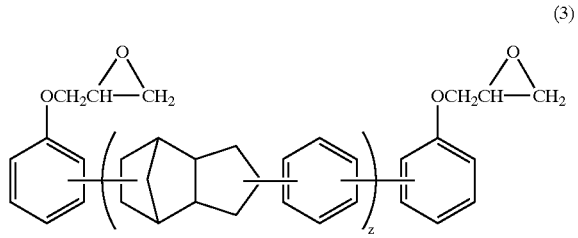
(3)

Herein z is an integer of at least 1, and usually 1 to 5.

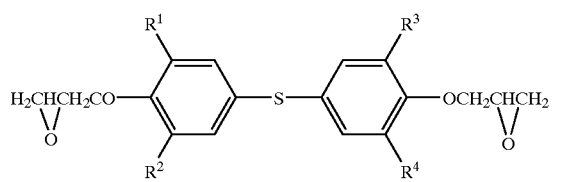
(4)

Herein $R^1$ to $R^4$ are each independently hydrogen or a monovalent hydrocarbon group of 1 to 6 carbon atoms, typically an alkyl group such as methyl, ethyl, propyl, isopropyl, n-butyl, isobutyl, tert-butyl, pentyl or hexyl.

Commercial examples of the solid epoxy resin (b) containing two or more epoxy functional groups in a molecule, represented by formulae (1) to (4), include NC3000P as the epoxy resin of formula (1), EPPN501 as the epoxy resin of formula (2) and XD-1000L as the epoxy resin of formula (3), all manufactured by Nippon Kayaku Co., Ltd.

The liquid epoxy resin (a) containing two or less epoxy functional groups in a molecule and the solid epoxy resin (b) containing two or more epoxy functional groups in a molecule, represented by formulae (1) to (4), are blended in such amounts that the solid epoxy resin (b) accounts for 10 to 80% by weight, preferably 20 to 50% by weight of the epoxy resin mixture. With less than 10% by weight of the solid epoxy resin (b), adhesion and toughness become poor. With more than 80% by weight of the solid epoxy resin (b), the viscosity increases to such an extent as to noticeably impede working.

In mixing these epoxy resins, the liquid epoxy resin (a) containing two or less epoxy functional groups in a molecule and the solid epoxy resin (b) containing two or more epoxy functional groups in a molecule, represented by formulae (1) to (4), are simultaneously or separately agitated, melted, mixed and dispersed while heating them at temperatures in the range of 80 to 120° C. The apparatus used for mixing, agitation and dispersion is not critical although a planetary mixer equipped with an agitator and a heater is often used.

The epoxy resin mixture of liquid and solid epoxy resins (a) and (b) should have a viscosity of up to 10,000 poises, desirably up to 7,000 poises at 25° C. as measured by an E type viscometer. A mixture with a viscosity of more than 10,000 poises provides the final composition with an increased viscosity, detracting from workability.

The epoxy resin mixture preferably has a total chlorine content of not more than 1,500 ppm, and especially not more than 1,000 ppm. When chlorine is extracted from the epoxy resin mixture with water at an epoxy resin concentration of 50% and a temperature of 100° C. over a period of 20 hours, the water-extracted chlorine content is preferably not more than 10 ppm. At a total chlorine content of more than 1,500 ppm or a water-extracted chlorine level of more than 10 ppm, the reliability of the sealed semiconductor device, particularly in the presence of moisture, may be compromised.

Curing Agent

The curing agent used herein is not critical as long as it can react with the epoxy resins for curing. Among others, acid anhydride curing agents are desirable. Suitable acid anhydride curing agents include methyltetrahydrophthalic anhydride, methylhexahydrophthalic anhydride, hexahydrophthalic anhydride, methylhymic anhydride, pyromellitic dianhydride, maleinized alloocimene, benzophenonetetracarboxylic dianhydride, 3,3',4,4'-biphenyltetrabisbenzophenonetetracarboxylic dianhydride, (3,4-dicarboxyphenyl) ether dianhydride, bis(3,4-dicarboxy-phenyl)methane dianhydride, 2,2-bis(3,4-dicarboxyphenyl)-propane dianhydride, and a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid.

In the practice of the invention, it is preferred to use a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid as the curing agent. In the mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid, it is desired to mix 20 to 60% by weight of the former with 80 to 40% by weight of the latter (the total is 100% by weight). Such curing agents are commercially available as YH306 and YH307 from Japan Epoxy Resins Co., Ltd.

An appropriate proportion of the above mixture in the curing agent is 5 to 75% by weight, more preferably 15 to 65% by weight of the entire curing agent. A curing agent with less than 5% by weight of the mixture may lead to poor adhesion and deterioration under hot humid conditions as in PCT. A curing agent with more than 75% by weight of the mixture may improve adhesion, but cracks may develop in the cured composition when tested as by a thermal cycling test.

The reminder of the curing agent is not critical and any of curing agents used in conventional curable epoxy resin compositions may be used. Suitable curing agents include acid anhydrides as described above, dicyandiamide, and carboxylic acid hydrazides such as adipic acid hydrazide and isophthalic acid hydrazide. Of these, methyltetrahydrophthalic anhydride, methylhexahydrophthalic anhydride and hexahydrophthalic anhydride are preferred. Then in one preferred embodiment, the mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid is combined with methyltetrahydrophthalic anhydride, methylhexahydrophthalic anhydride or hexahydrophthalic anhydride.

The total amount of the curing agent used herein is an effective amount to cure the epoxy resin and differs with the type of curing agent. When the curing agent is an acid anhydride, it is preferably used in such amounts that the molar ratio of carboxylic acid groups derived from the acid anhydride group (—CO—O—CO—) in the curing agent to epoxy groups in the epoxy resin may range from 0.5 to 1.5. A molar ratio of less than 0.5 may lead to under-curing whereas at a molar ratio of more than 1.5, some acid anhydride may be left unreacted, leading to a lowering of glass transition temperature. The preferred molar ratio of carboxylic acid groups to epoxy groups is from 0.8 to 1.2. Differently stated, for the same reason as above, the acid anhydride curing agent is preferably used in such amounts that the molar ratio of acid anhydride groups in the acid anhydride to epoxy groups in the epoxy resin may range from 0.3 to 0.7, more preferably from 0.4 to 0.6.

Curing Accelerator

In the inventive composition, the curing or reaction accelerator is blended for the purpose of accelerating cure of the epoxy resin. The curing accelerator is typically selected from among imidazole compounds and organophosphorus compounds. Most preferably, the curing accelerator is comprised of catalyzed microcapsules containing an imidazole compound or organophosphorus compound and having an average particle size of 0.5 to 10 μm, the quantity of the catalyst leached out from the microcapsules in o-cresol at 30° C. for 15 minutes being at least 70% by weight of the entire catalyst quantity in the microcapsules.

The imidazole compounds that can be used include those of the following general formula (5).

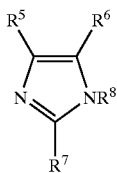

(5)

Herein, $R^5$ and $R^6$ are independently selected from among —H, —CH$_3$, —C$_2$H$_5$, —CH$_2$OH and —C$_6$H$_5$; $R^7$ is selected from among —CH$_3$, —C$_2$H$_5$, —C$_6$H$_5$ and allyl; and $R^8$ is selected from among —H, —CH$_3$, —C$_2$H$_5$, and a group of formula (6) below.

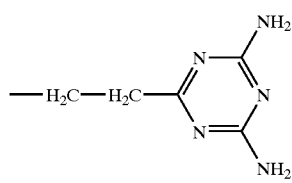

(6)

Examples of suitable imidazole compounds include 2-methylimidazole, 2-ethylimidazole, 2-undecylimidazole, 2,4-dimethylimidazole, 2-heptadecylimidazole, 1,2-dimethylimidazole, 1,2-diethylimidazole, 2-ethyl-4-methylimidazole, 2-phenylimidazole, 1-benzyl-2-phenylimidazole, 1-cyanoethyl-2-methylimidazole, 1-cyanoethyl-2-undecylimidazole, 1-benzyl-2-methylimidazole, 2,4-diamino-6-[2'-methylimidazolyl-(1)']-ethyl-S-triazine, 2,4-diamino-6-[2'-ethyl-4'-methylimidazolyl-(1)']-ethyl-S-triazine, 2,4-diamino-6-[2'-undecylimidazolyl]-ethyl-S-triazine, the isocyanuric acid addition product of 2,4-diamino-6-[2'-methylimidazolyl-(1)']-ethyl-S-triazine, 2-phenyl-4-methyl-5-hydroxymethylimidazole, 2-phenyl-4,5-dihydroxymethylimidazole, and 2-aryl-4,5-diphenylimidazoles. Of these, preferred are 2-methylimidazole, 2-ethylimidazole, 1,2-dimethylimidazole, 1,2-diethylimidazole, 2-ethyl-4-methylimidazole, 2-undecylimidazole, 2-heptadecylimidazole and 2-phenylimidazole.

Suitable organophosphorus compounds include the salt of a triorganophosphine (e.g., triphenylphosphine, tributylphosphine, tri(p-methylphenyl)phosphine, tri(nonylphenyl)phosphine or diphenyltolylphoshine) with a triorganoborane, the salt of a tetraorganophosphonium with a tetraorganoborate such as tetraphenylphosphonium tetraphenylborate, and tetraphenylphosphine thiocyanide. Of these, organophosphorus compounds of the following general formula (7) and (8):

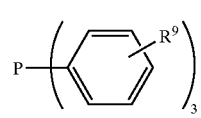

(7)

wherein $R^9$ is hydrogen or an alkyl group of 1 to 4 carbon atoms, and

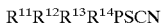 R$^{11}$R$^{12}$R$^{13}$R$^{14}$PSCN (8)

wherein $R^{11}$, $R^{12}$, $R^{13}$ and $R^{14}$ each are an organic group having 1 to 20 carbon atoms are preferred, with those of formula (8) being most preferred.

In formula (7), $R^9$ is preferably hydrogen or methyl. In formula (8), the organic groups represented by $R^{11}$, $R^{12}$, $R^{13}$ and $R^{14}$ are those of 1 to 20 carbon atoms, preferably 1 to 6 carbon atoms, for example, alkyl groups such as methyl, ethyl, propyl, butyl, methoxy, and ethoxyethyl; alkenyl groups such as vinyl, allyl and isopropenyl; aryl groups such as phenyl; acetyl, propionyl; and substituted ones of the foregoing hydrocarbons in which some or all of the hydrogen atoms are substituted with halogen atoms (e.g., chlorine, fluorine and bromine), i.e., halogenated monovalent hydrocarbon groups such as fluoromethyl, bromoethyl and trifluoropropyl.

The microcapsules employed in the invention use as the shell material any of polymers composed of (meth)acrylic monomers such as C$_{1-8}$ alkyl esters of acrylic acid, methacrylic acid, itaconic acid or crotonic acid, or C$_{1-8}$ alkyl esters of the same type in which some or all of the hydrogen atoms on the alkyl group are substituted with allyl groups or the like; monofunctional monomers such as styrene, α-methylstyrene, acrylonitrile, methacrylonitrile or vinyl acetate; and polyfunctional monomers such as ethylene glycol di(meth)acrylate, polyethylene glycol di(meth) acrylate, divinylbenzene, bisphenol A di(meth)acrylate and methylene-bis(meth)acrylamide. The imidazole compound and/or organophosphorus compound serving as the curing catalyst is enclosed within the polymer shell. Of the above polymers, polymers of (meth)acrylic monomers are preferred.

A variety of methods may be used to produce the microencapsulated curing catalyst. The use of a method known to the art, such as suspension polymerization or emulsion polymerization, is advantageous for the efficient production of microcapsules of good sphericity.

To obtain a high-concentration microencapsulated catalyst using a curing catalyst of customary molecular structure, the above-described monomer is used in an overall amount of preferably about 10 to 200 parts by weight, more preferably 10 to 100 parts by weight, and most preferably 20 to 50 parts by weight, per 10 parts by weight of the curing catalyst. Less than 10 parts by weight of the monomer may be difficult for the microcapsule to impart sufficient latency to the curing catalyst. On the other hand, the use of more than 200 parts by weight of the monomer lowers the proportion of catalyst, which may make it necessary to use a large amount of microencapsulated catalyst to achieve sufficient curability and can therefore be economically undesirable.

The microcapsules produced by the foregoing process preferably have an average particle size of 0.5 to 10 $\mu$m, more preferably an average particle size of 0.5 to 10 $\mu$m and a maximum particle size of not more than 50 $\mu$m, and most preferably an average particle size of 2 to 5 $\mu$m and a maximum particle size of not more than 20 $\mu$m. Microcapsules with an average particle size of less than 0.5 $\mu$m have too large a specific surface area so that the incorporation of such microcapsules in the composition may increase the viscosity thereof. On the other hand, microcapsules with an average particle size greater than 10 $\mu$m may be dispersed in the resin component non-uniformly, leading to a decline of reliability.

The microencapsulated catalyst used herein preferably has a performance such that, when 1 g of the curing catalyst-containing microcapsules is measured out and mixed into 30 g of o-cresol, the mixture is left to stand at 30° C. for 15 minutes, and the amount of catalyst that has dissolved out of the microcapsules is determined by gas chromatography, catalyst dissolution from the microcapsules into o-cresol corresponds to at least 70 wt %, more preferably at least 75 wt % of the total amount of catalyst in the microcapsules. At a dissolution of less than 70 wt %, a longer curing time may become necessary, leading to a drop of productivity.

An appropriate amount of the microencapsulated curing accelerator blended is 1 to 15 parts by weight, more preferably 2 to 10 parts by weight, per 100 parts by weight of the epoxy resin. Less than 1 part of the accelerator may be less effective for curing whereas more than 15 parts by weight may provide excellent cure at the sacrifice of shelf stability.

As the curing accelerator, a non-microencapsulated catalyst selected from the foregoing may be used in admixture with the microencapsulated catalyst. In this embodiment, the amount of the catalyst within microcapsules and the non-microencapsulated catalyst combined is preferably 1 to 15 parts, especially 2 to 7 parts by weight per 100 parts by weight of the epoxy resin. Less than 1 part by weight may be less effective for curing whereas more than 15 parts by weight may provide excellent cure at the sacrifice of shelf stability.

Alternatively, a non-microencapsulated catalyst selected from the foregoing may be used alone. In this embodiment, the amount of the non-microencapsulated catalyst is preferably 0.1 to 15 parts, especially 0.5 to 7 parts by weight per 100 parts by weight of the epoxy resin. Less than 0.1 part by weight may be less effective for curing whereas more than 15 parts by weight may provide excellent cure at the sacrifice of shelf stability.

Inorganic Filler

Any inorganic filler known to be useful for lowering the expansion coefficient is included in the inventive composition. Specific examples include fused silica, crystalline silica, aluminum, alumina, aluminum nitride, boron nitride, silicon nitride, magnesia and magnesium silicate. Of these, spherical fused silica is desirable for achieving low viscosity.

When the liquid epoxy resin composition is used as a potting material, the inorganic filler desirably has an average particle size of 2 to 20 $\mu$m and a maximum particle size of preferably up to 75 $\mu$m, more preferably up to 50 $\mu$m. A filler with an average particle size of less than 2 $\mu$m may provide an increased viscosity and cannot be loaded in large amounts. An average particle size of more than 20 $\mu$m means the inclusion of a more proportion of coarse particles which will catch on lead wires, causing voids.

The amount of the filler included in the composition is in a range of preferably 100 to 600 parts by weight per 100 parts by weight of the epoxy resin. With less than 100 parts by weight of the filler, the expansion coefficient tends to be too large, which may cause cracks to form in a thermal cycling test. On the other hand, at more than 600 parts by weight, the viscosity rises, which may bring about a decline in flow.

When the liquid epoxy resin composition is used as an underfill which should exhibit both improved penetration and a lower linear expansion, it is advantageous to include an inorganic filler having an average particle size at most about one-tenth as large and a maximum particle size at most one-half as large as the size of the flip chip gap (between the substrate and semiconductor chip in a flip chip semiconductor device). In this embodiment, the amount of inorganic filler included in the composition is in a range of preferably 50 to 400 parts by weight, and especially 100 to 250 parts by weight, per 100 parts by weight of the epoxy resin. A composition with less than 50 parts by weight of the filler may have too large an expansion coefficient and crack in a thermal cycling test. A composition with more than 400 parts by weight of the filler may have an increased viscosity, which may bring about a decline in thin-film penetration.

In the epoxy resin composition of the invention, silicone rubbers, silicone oils, liquid polybutadiene rubbers, and thermoplastic resins such as methyl methacrylate-butadiene-styrene copolymers may be included for the stress reduction purpose. Preferably, the stress reducing agent is a copolymer of an alkenyl group-bearing epoxy resin or phenolic resin with an SiH group-bearing organopolysiloxane, more specifically a copolymer prepared by the addition reaction of the alkenyl groups within an alkenyl group-bearing epoxy resin or phenolic resin with the SiH groups in an SiH group-bearing organopolysiloxane of formula (9) below having 20 to 400 silicon atoms and 1 to 5 SiH groups per molecule.

$$H_a R^{15}_b SiO_{(4-a-b)/2} \qquad (9)$$

In formula (9), $R^{15}$ is a substituted or unsubstituted monovalent hydrocarbon group, "a" is a positive number from 0.01 to 0.1, "b" is a positive number from 1.8 to 2.2, and the sum of a+b is from 1.81 to 2.3.

The monovalent hydrocarbon group represented by $R^{15}$ preferably has 1 to 10 carbons, and especially 1 to 8 carbons. Illustrative examples include alkyl groups such as methyl, ethyl, propyl, isopropyl, butyl, isobutyl, tert-butyl, hexyl, octyl and decyl; alkenyl groups such as vinyl, allyl, propenyl, butenyl and hexenyl; aryl groups such as phenyl, xylyl and tolyl; aralkyl groups such as benzyl, phenylethyl and phenylpropyl; and halogenated monovalent hydrocarbon groups in which some or all of the hydrogen atoms on the hydrocarbon groups have been substituted with halogen atoms (e.g., chlorine, fluorine, bromine), such as fluoromethyl, bromoethyl and trifluoropropyl.

Copolymers having the following structure are preferred.

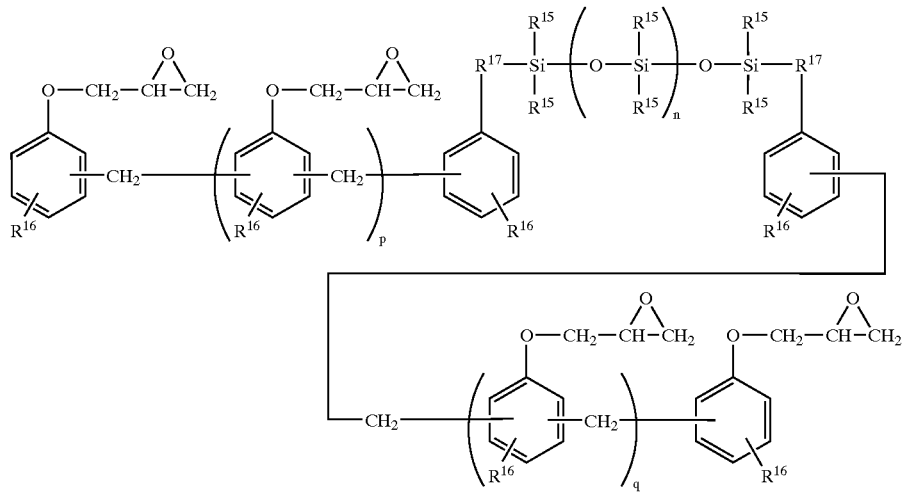

In the above formula, $R^{15}$ is as defined above, $R^{16}$ is a hydrogen atom or an alkyl of 1 to 4 carbons, and $R^{17}$ is $-CH_2CH_2CH_2-$, $-OCH_2-CH(OH)-CH_2-O-CH_2CH_2CH_2-$ or $-O-CH_2CH_2CH_2-$. The letter n is an integer from 4 to 199, and preferably from 19 to 99, p is an integer from 1 to 10, and q is an integer from 1 to 10.

The above-described copolymer is included in the inventive composition such that the amount of diorganopolysiloxane units is 0 to 20 parts by weight, and preferably 2 to 15 parts by weight, per 100 parts by weight of the epoxy resin, whereby stress can be further reduced.

If necessary, the liquid epoxy resin composition may further contain other additives as long as they do not compromise the objects of the invention. Suitable additives include carbon-functional silanes for improving adhesion, pigments (e.g., carbon black), dyes, antioxidants, and surface treating agents (e.g., y-glycidoxypropyltrimethoxysilane).

The liquid epoxy resin composition of the invention may be prepared by the simultaneous or discrete agitation, melting, mixing and dispersion of the epoxy resin, curing agent, curing accelerator and inorganic filler as well as optional components, while carrying out heat treatment if necessary. No particular limitation is imposed on the apparatus used for mixing, agitating, dispersing and otherwise processing the mixture of components. Exemplary apparatus suitable for this purpose include an automated mortar, three-roll mill, ball mill and planetary mixer. Use can also be made of suitable combinations of these apparatuses.

The liquid epoxy resin composition of the invention for use as a sealant or encapsulant should desirably have a viscosity of up to 10,000 poises at 25° C.

Also the composition should have a toughness $K_{1c}$ of at least 3.0, preferably at least 3.3. A composition with a toughness $K_{1c}$ of less than 3.0 may be weak to thermal cycling.

An ordinary molding method and ordinary molding conditions may be employed when sealing semiconductor devices with the inventive composition. It is preferable to carry out an initial hot oven cure at about 100 to 120° C. for at least about ½ hour, followed by a subsequent hot oven cure at about 150° C. for at least about ½ hour. Initial curing conditions below the above-mentioned temperature and time may result in void formation after curing, and subsequent curing conditions below the temperature and time indicated above may yield a cured product having less than sufficient properties.

The semiconductor devices to be sealed with the inventive composition are typically flip chip-type semiconductor devices. Referring to FIG. 1, the flip chip-type semiconductor device includes an organic substrate 1 having an interconnect pattern side on which is mounted a semiconductor chip 3 over a plurality of intervening bumps 2. The gap between the organic substrate 1 and the semiconductor chip 3 (shown in the diagram as gaps between the bumps 2) is filled with an underfill material 4, and the lateral edges of the gap and the periphery of semiconductor chip 3 are sealed with a fillet material 5. The inventive liquid epoxy resin composition is especially suitable in forming the underfill.

When the inventive composition is used as an underfill material, the cured product preferably has an expansion coefficient of 20 to 40 ppm/° C. below the glass transition temperature (Tg).

Sealant used as the fillet material may be a conventional material known to the art. The use as the fillet of a liquid epoxy resin composition of the same type as the present invention is especially preferred. The cured product in this case preferably has an expansion coefficient of 10 to 20 ppm/° C. below the Tg.

EXAMPLE

Examples of the invention and comparative examples are given below by way of illustration, and are not intended to limit the invention.

Examples 1–5 and Comparative Examples 1–4

The components shown in Table 1 were blended to uniformity on a three-roll mill to give nine resin compositions. These resin compositions were examined by the following tests. The results are also shown in Table 1.

[Viscosity]

The viscosity at 25° C. was measured using a BH-type rotary viscometer at a rotational speed of 4 rpm.

[Gelation Time]

The gelation time for the composition was measured on a hot plate at 150° C.

[Toughness $K_{1c}$]

The toughness $K_{1c}$ at normal temperature was measured according to ASTM D5045.

[Glass Transition Temperature (Tg)]

Using a sample of the cured composition measuring 5×5×15 mm, the glass transition temperature was measured with a thermomechanical analyzer at a heating rate of 5° C./min.

[Coefficients of Thermal Expansion (CTE)]

Based on the Tg measurement described above, a coefficient of thermal expansion below Tg (CTE-1) was determined for a temperature range of 50 to 80° C., and a coefficient of thermal expansion above Tg (CTE-2) was determined for a temperature range of 200 to 230° C.

[Bond Strength Test]

On a photosensitive polyimide-coated silicon chip was rested a frustoconical sample having a bottom diameter of 5 mm and a height of 3 mm. It was cured at 150° C. for 3 hours. At the end of curing, the sample was measured for (initial) shear bond strength. The cured sample was then placed in a pressure cooker test (PCT) environment of 121° C. and 2.1 atm for 168 hours for moisture absorption. At the end of PCT test, shear bond strength was measured again. In each Example, five samples were used, from which an average bond strength value was calculated.

[PCT Delamination Test]

A polyimide-coated 10×10 mm silicon chip was stacked on a 30×30 mm FR-4 substrate using spacers of approximately 100 μm thick, leaving a gap therebetween. An epoxy resin composition was introduced into the gap and cured. The assembly was held at 30° C. and RH 65% for 192 hours and then processed 5 times by IR reflow set at a maximum temperature of 265° C., before the assembly was checked for delamination. Separately, the assembly was placed in a PCT environment of 121° C. and 2.1 atm for 168 hours, before the assembly was checked for delamination. Delamination was inspected by C-SAM (by SONIX Co., Ltd.).

[Thermal Shock Test]

A polyimide-coated 10×10 mm silicon chip was stacked on a 30×30 mm FR-4 substrate using spacers of approximately 100 μm thick, leaving a gap therebetween. An epoxy resin composition was introduced into the gap and cured. The assembly was held at 30° C. and RH 65% for 192 hours and then processed 5 times by IR reflow set at a maximum temperature of 265° C. The assembly was then tested by thermal cycling between −65° C./30 minutes and 150° C./30 minutes. After 250, 500 and 750 cycles, the assembly was examined for peeling and cracks.

TABLE 1

| Component (pbw) | Example 1 | Example 2 | Example 3 | Example 4 | Example 5 | Comparative Example 1 | Comparative Example 2 | Comparative Example 3 | Comparative Example 4 |
|---|---|---|---|---|---|---|---|---|---|
| Epoxy resin A | 48 | | | 25 | | | | | |
| Epoxy resin B | | 48 | | | | | | | |
| Epoxy resin C | | | 48 | 15 | | | | | |
| Epoxy resin D | | | | | 50 | | | | |
| Epoxy resin E | | | | | | | 45 | | |
| Epoxy resin F | | | | | | | | 49 | 49 |
| RE303S-L | | | | | | 50 | | | |
| MH700 | 30 | 30 | 30 | 30 | 30 | 30 | 30 | 30 | 50 |
| YH307 | 20 | 20 | 20 | 20 | 20 | 20 | 20 | 20 | |
| SE15FC | 150 | 150 | 150 | 150 | 150 | 150 | 150 | 150 | 150 |
| KBM403 | 1.0 | 1.0 | 1.0 | 1.0 | 1.0 | 1.0 | 1.0 | 1.0 | 1.0 |
| Copolymer | 4 | 4 | 4 | 4 | 4 | 4 | 4 | 4 | 4 |
| 2E4MZ | | | | 1 | | | | | 1 |
| Microcapsule of 2E4MZ | 5 | 5 | 5 | | 5 | 5 | 5 | 5 | |
| Measurement results | | | | | | | | | |
| Viscosity at 25° C. (Pa · s) | 39.2 | 38.8 | 45.2 | 59.3 | 78.5 | 28.4 | 34.5 | 165 | 49.7 |
| Gelation time at 150° C. (s) | 100 | 118 | 108 | 125 | 140 | 86 | 97 | 145 | 130 |
| Toughness $K_{1c}$ | 3.7 | 3.3 | 3.7 | 3.3 | 3.5 | 2.6 | 2.8 | 3.3 | 3.1 |
| Tg (° C.) | 135 | 137 | 135 | 137 | 138 | 140 | 138 | 138 | 142 |
| CTE-1 (ppm/° C.) | 32 | 33 | 32 | 32 | 33 | 31 | 30 | 32 | 30 |
| CTE-2 (ppm/° C.) | 112 | 114 | 114 | 112 | 114 | 113 | 112 | 115 | 112 |
| PCT delamination test | | | | | | | | | |
| After 5 times of IR reflow at 265° C. | no delamination | no delamination | no delamination | no delamination | no delamination | delaminated | delaminated | not penetrated | no delamination |
| After PCT 168 hr | no delamination | no delamination | no delamination | no delamination | no delamination | delaminated | delaminated | not penetrated | delaminated |
| Bond strength (kgf/cm²) | | | | | | | | | |
| Initial | 108 | 102 | 105 | 108 | 98 | 102 | 104 | 108 | 97 |
| After PCT 168 hr | 105 | 99 | 105 | 100 | 85 | 95 | 75 | 108 | 0 |

TABLE 1-continued

| | Example | | | | | Comparative Example | | | |
|---|---|---|---|---|---|---|---|---|---|
| Component (pbw) | 1 | 2 | 3 | 4 | 5 | 1 | 2 | 3 | 4 |
| Failure (%) after thermal shock test | | | | | | | | | |
| 250 cycles | 0 | 0 | 0 | 0 | 0 | 50 | 0 | — | 0 |
| 500 cycles | 0 | 0 | 0 | 0 | 0 | 100 | 0 | — | 0 |
| 750 cycles | 0 | 10 | 0 | 0 | 0 | — | 30 | — | 10 |

Components:

Epoxy resin A: obtained by melt mixing NC3000P/RE303S-L in a weight ratio 1/5, both available from Nippon Kayaku Co., Ltd., viscosity 4,300 poises at 25° C. NC3000P has the following formula (1'):

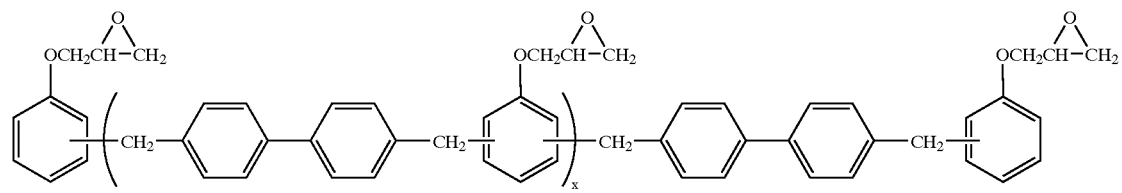

wherein x is 0 to 5.

Epoxy resin B: obtained by melt mixing EPPN501/RE303S-L in a weight ratio 1/5, both available from Nippon Kayaku Co., Ltd., viscosity 3,900 poises at 25° C. EPPN501 has the following formula (2'):

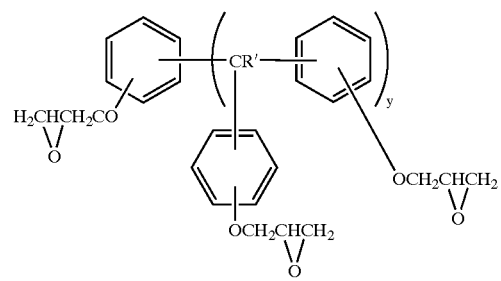

wherein y is 1 to 2.

Epoxy resin C: obtained by melt mixing XD-1000L/RE303S-L in a weight ratio 1/5, both available from Nippon Kayaku Co., Ltd., viscosity 6,100 poises at 25° C. XD-1000L has the following formula (3'):

wherein z is 1.

Epoxy resin D: obtained by melt mixing NC3000P/RE303S-L in a weight ratio 1/1, both available from Nippon Kayaku Co., Ltd., viscosity 9,800 poises at 25° C.

Epoxy resin E: obtained by melt mixing NC3000P/RE303S-L in a weight ratio 0.8/10, both available from Nippon Kayaku Co., Ltd., viscosity 700 poises at 25° C.

Epoxy resin F: obtained by melt mixing XD-1000L/RE303S-L in a weight ratio 6/1, both available from Nippon Kayaku Co., Ltd., viscosity at 25° C. unmeasurable RE303S-L: bisphenol F-type epoxy resin, Nippon Kayaku Co., Ltd.

MH700: methyltetrahydrophthalic anhydride, New Japan Chemical Co., Ltd.

YH307: a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid in a weight ratio of 6/4, Japan Epoxy Resins Co., Ltd.

SE8FC: spherical silica having a maximum particle size of up to 24 μm, Tokuyama Soda Co., Ltd.

KBM403: silane coupling agent, γ-glycidoxypropyltrimethoxy-silane, Shin-Etsu Chemical Co., Ltd.

2E4MZ: 2-ethyl-4-methylimidazole, Shikoku Chemicals Co., Ltd.

Microcapsules of 2E4MZ: A methyl methacrylate polymer which contains 20 wt % of 2E4MZ. Average particle size, 7 μm. Amount of curing catalyst which dissolves from microcapsules during 15 minutes of immersion in o-cresol at 30° C., 87 wt %.

Copolymer: the addition reaction product of

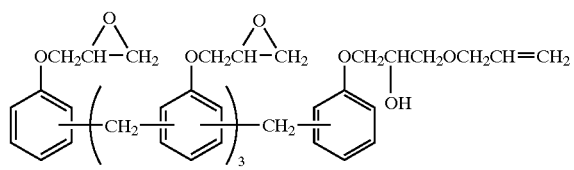

and

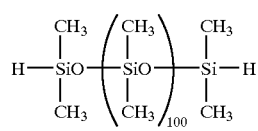

It has been demonstrated that the liquid epoxy resin composition of the invention cures into a cured product which has improved adhesion to the surface of silicon chips and especially to photosensitive polyimide resins and nitride films, does not suffer a failure even when the temperature of reflow after moisture absorption elevates from the conventional temperature of nearly 240° C. to 260–270° C., does not deteriorate under hot humid conditions as encountered in PCT (120° C./2.1 atm), and does not peel or crack over several hundred cycles of thermal cycling between −65° C. and 150° C. The composition is thus best suited as a sealant for semiconductor devices.

Japanese Patent Application No. 2001-391194 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A liquid epoxy resin composition comprising a liquid epoxy resin, a curing agent, a curing accelerator, and an inorganic filler as essential components, said liquid epoxy resin comprising a mixture of (a) an epoxy resin containing two or less epoxy functional groups in a molecule and being liquid at normal temperature and (b) an epoxy resin containing two or more epoxy functional groups in a molecule and being solid at normal temperature in a weight ratio of epoxy resin (a)/epoxy resin (b) of from 9/1 to 1/4, said solid epoxy resin (b) being selected from epoxy resins of the following general formulae (1) to (4) and combinations thereof:

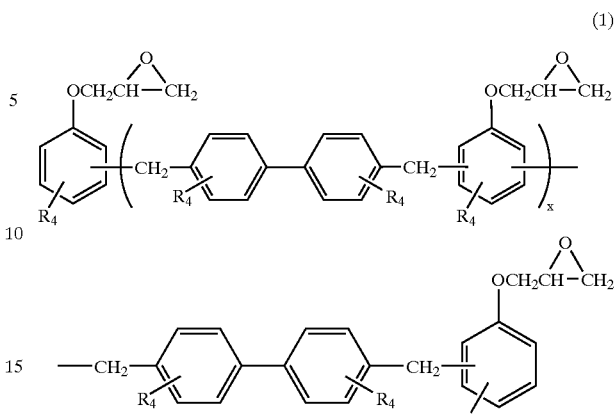

wherein R is independently hydrogen, $C_1$–$C_4$ alkyl or phenyl, and x is 0 to 10,

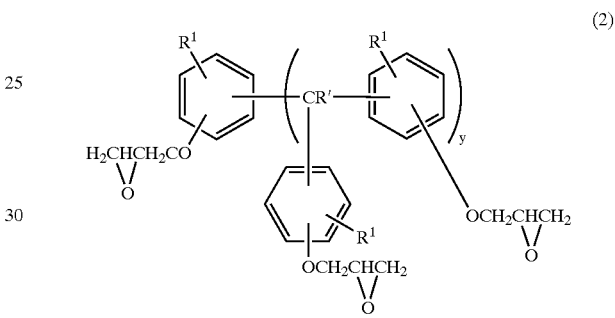

wherein $R^1$ is hydrogen or a monovalent hydrocarbon group of 1 to 6 carbon atoms, $R^1$ is hydrogen, methyl or ethyl, and y is an integer of 0 to 6,

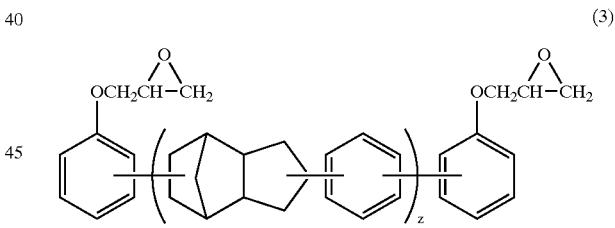

wherein z is an integer of at least 1,

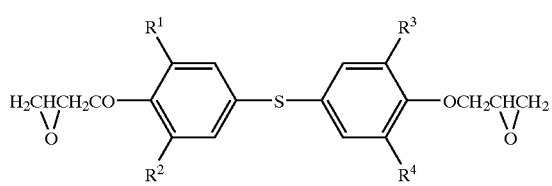

wherein $R^1$ to $R^4$ are each independently hydrogen or a monovalent hydrocarbon group of 1 to 6 carbon atoms, said epoxy resin mixture having a viscosity of up to 10,000 poises at 25° C. as measured by an E type viscometer, the composition having a toughness $K_{1c}$ of at least 3.0.

2. The liquid epoxy resin composition of claim 1 wherein the curing agent contains 5 to 75% by weight, based on the entire curing agent, of a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid.

3. The liquid epoxy resin composition of claim 2 wherein the curing agent comprises a mixture of 3,4-dimethyl-6-(2-methyl-1-propenyl)-1,2,3,6-tetrahydrophthalic acid and 1-isopropyl-4-methyl-bicyclo[2.2.2]oct-5-ene-2,3-dicarboxylic acid, combined with methyltetrahydrophthalic anhydride, methylhexahydrophthalic anhydride or hexahydrophthalic anhydride.

4. The liquid epoxy resin composition of claim 1 wherein the curing accelerator is an imidazole compound or organophosphorus compound.

5. The liquid epoxy resin composition of claim 4 wherein the curing accelerator is comprised of catalyzed microcapsules containing the imidazole compound or organophosphorus compound and having an average particle size of 0.5 to 10 μm, the quantity of the catalyst leached out from the microcapsules in o-cresol at 30° C. for 15 minutes being at least 70% by weight of the entire catalyst quantity in the microcapsules.

6. The liquid epoxy resin composition of claim 4 wherein the imidazole compound is selected from the group consisting of 2-methylimidazole, 2-ethylimidazole, 1,2-dimethylimidazole, 1,2-diethylimidazole, 2-ethyl-4-methylimidazole, 2-undecylimidazole, 2-heptadecylimidazole, and 2-phenylimidazole.

7. The liquid epoxy resin composition of claim 4 wherein the organophosphorus compound has the formula (8):

$$R^{11}R^{12}R^{13}R^{14}PSCN \qquad (8)$$

wherein $R^{11}$, $R^{12}$, $R^{13}$ and $R^{14}$ each are an organic group having 1 to 20 carbon atoms.

8. A semiconductor device which is sealed with the liquid epoxy resin composition of claim 1 in the cured state.

9. A flip chip type semiconductor device which is sealed with the liquid epoxy resin composition of claim 1 in the cured state.

* * * * *